(12) United States Patent
Pigott

(10) Patent No.: US 10,139,448 B2
(45) Date of Patent: Nov. 27, 2018

(54) SCAN CIRCUITRY WITH IDDQ VERIFICATION

(71) Applicant: FREESCALE SEMICONDUCTOR, INC., Austin, TX (US)

(72) Inventor: John M. Pigott, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/252,577

(22) Filed: Aug. 31, 2016

(65) Prior Publication Data
US 2018/0059177 A1    Mar. 1, 2018

(51) Int. Cl.
| | | |
|---|---|---|
| G01R 31/3177 | (2006.01) | |
| G01R 31/317 | (2006.01) | |
| G01R 31/30 | (2006.01) | |
| G01R 31/3185 | (2006.01) | |

(52) U.S. Cl.
CPC ..... *G01R 31/3177* (2013.01); *G01R 31/3004* (2013.01); *G01R 31/3008* (2013.01); *G01R 31/3012* (2013.01); *G01R 31/31723* (2013.01); *G01R 31/318533* (2013.01); *G01R 31/318575* (2013.01); *G01R 31/318577* (2013.01)

(58) Field of Classification Search
CPC ............ G01R 31/3177; G01R 31/3004; G01R 31/31723
See application file for complete search history.

(56) References Cited

U.S. PATENT DOCUMENTS

| | | | | |
|---|---|---|---|---|
| 5,459,737 | A | * | 10/1995 | Andrews ............ G01R 31/3004 714/721 |
| 5,726,997 | A | * | 3/1998 | Teene ................. G01R 31/3004 324/537 |
| 6,119,250 | A | * | 9/2000 | Nishimura ....... G01R 31/31701 365/201 |
| 7,272,767 | B2 | | 9/2007 | Colunga et al. |
| 8,044,676 | B2 | | 10/2011 | Hammerschmidt |
| 2007/0168803 | A1 | | 7/2007 | Wang et al. |
| 2008/0129324 | A1 | * | 6/2008 | Pastel ................ G01R 31/3008 324/762.02 |
| 2010/0164535 | A1 | | 7/2010 | Hoshika et al. |
| 2011/0187396 | A1 | | 8/2011 | Jarrige et al. |

* cited by examiner

*Primary Examiner* — Joseph D Torres

(57) ABSTRACT

An integrated circuitry includes a first logic block coupled between a first power supply terminal and a second power supply terminal. The first logic block includes a first scan chain and a configurable defect coupled to a scan output node of the first scan chain. The configurable defect has a logic node and a conductive element coupled between the logic node and the first or the second power supply terminal. The configurable defect is configured to, during a quiescent current testing mode, place a predetermined logic state on the logic node such that a current flows through the conductive element. The current can be detected by external equipment.

19 Claims, 3 Drawing Sheets

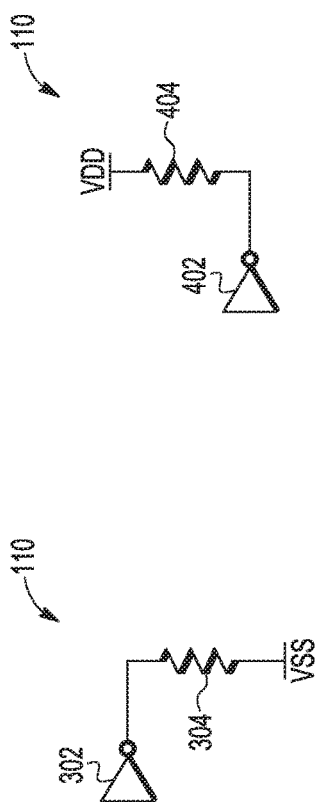
FIG. 3
FIG. 4
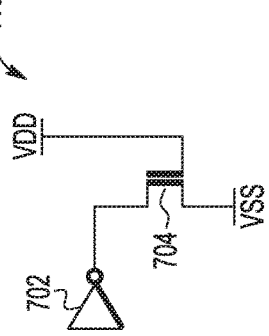
FIG. 5
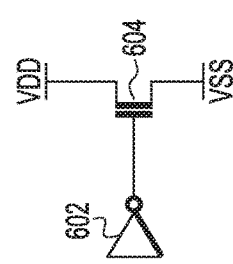
FIG. 6
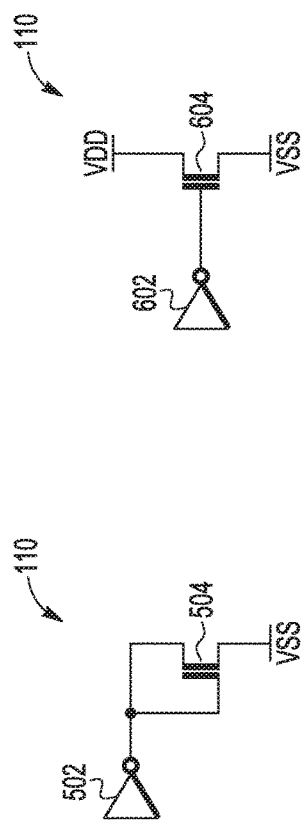
FIG. 7

SCAN CIRCUITRY WITH IDDQ VERIFICATION

BACKGROUND OF THE INVENTION

The present invention relates generally to integrated circuits, and more particularly, to quiescent current (IDDQ) verification for scan test circuitry.

Integrated circuits (ICs) including system-on-chips (SoCs) integrate various digital and sometimes analog components on a single chip. ICs may have manufacturing defects such as physical failures and fabrication defects that cause the ICs to malfunction. Thus, the ICs need to be tested to detect manufacturing defects. Design for test (DFT) techniques add testability features to ICs that allow automatic test equipment (ATE) to execute various fault tests using test patterns generated by an automatic test pattern generator (ATPG) on the ICs to identify manufacturing defects. ICs undergoing testing are referred to as devices-under-test (DUT).

ICs that undergo fault testing include multiple scan flip-flops that form scan chains. Specific vectors of data are shifted in one end of each scan chain and results out the other end with the results compared with expectations to detect any faults. At each vector application, the IDDQ current consumed by the circuit may be measured and compared to predetermined limits. It is important to ensure that the IDDQ measurement circuitry and instruments are operating correctly. Vectors are a set of inputs designed to test a system. Various vectors can be used to test a system's behavior in response to various inputs. Scan testing has two components: one component for functional (logic) testing, and another component for IDDQ testing. The same chain (but different vectors) is used for each.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

FIGS. 3-7 are schematic circuitry diagrams of examples of circuitry components that can be used as a conductive element in the quiescent current verification system of FIG. 1.

DETAILED DESCRIPTION OF THE PRESENT INVENTION

The detailed description of the appended drawings is intended as a description of the currently preferred embodiments of the present invention, and is not intended to represent the only forms in which the present invention may be practiced. It is to be understood that the same or equivalent functions may be accomplished by different embodiments that are intended to be encompassed within the scope of the claims.

Embodiments of integrated circuits and methods are disclosed in which one or more verification vectors are added to a set of scan test vectors. A verification circuitry is added which consumes detectable additional current only when the verification vector(s) are configured by shifting the vectors into the scan chain. By observing a changed current during the verification vector configuration(s), automated test equipment (ATE) can verify that a quiescent current (IDDQ) test setup is functioning correctly and would detect true IDDQ failures if they occur. The verification vectors and circuitry thus allow manufacturers and users to determine whether IDDQ failures exist, as well as to determine whether the ATE is configured correctly.

Figure 1:
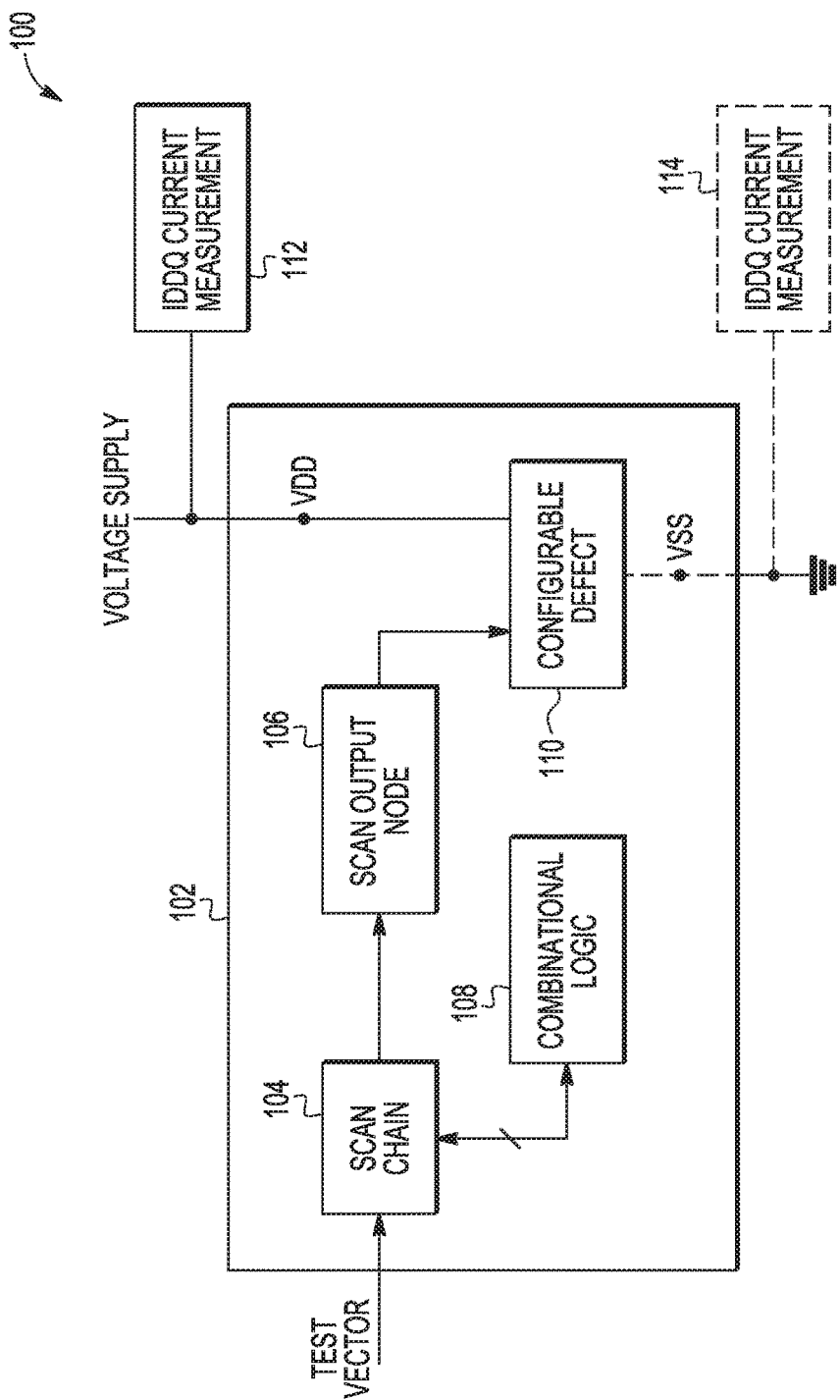
FIG. 1 is a block diagram of a quiescent current verification system in accordance with selected embodiments of the present invention.

FIG. 1 is a block diagram of a quiescent current verification system 100 in accordance with selected embodiments of the present invention including integrated circuitry 102 having scan chain 104, scan output node 106, combinational logic 108 and configurable defect 110. Configurable defect 110 is coupled between first voltage supply terminal VDD and second voltage supply terminal VSS (or ground). ATE with IDDQ current measurement circuitry 112, 114 can be coupled to first voltage supply terminal VDD at a first terminal of configurable defect 110. Alternatively, IDDQ current measurement circuitry 112, 114 may be coupled to the second voltage supply terminal VSS at a second terminal of configurable defect 110. Either way, IDDQ current measurement circuitry 112, 114 can detect whether configurable defect 110 is consuming current under the control of scan output node 106.

Combinational logic 108 and scan chain 104 can be any integrated circuitry that is subject to scan test to verify proper operation, such as a processor, sensor, memory or other device composed of digital and/or analog electronic components. IDDQ current measurement circuitry 112, 114 along with corresponding scan chain(s) 104 and combinational logic 108 can be implemented in any suitable ATE system for electronic devices or systems.

External test equipment provides one or more test vectors to scan chain 104. An output of scan chain 104 is provided to scan output node 106. Scan output node 106 is configured to provide input to configurable defect 110. When enabled, configurable defect 110 consumes an additional detectable current from the voltage supply. At each stage in the scan chain 104, the output from one latch circuitry is provided as data to the combinational logic 108 and as input to a subsequent latch circuit. The output of latch circuitry in scan chain 104 is provided as input to scan output node 106. Current through configurable defect 110 can be detected by IDDQ current measurement circuitry 112, 114. IDDQ current measurement circuitry 114 can be coupled to measure current at ground terminal 116 in addition to, or instead of IDDQ current measurement circuitry 112 that is coupled to supply voltage terminal VDD. IDDQ current measurement circuitry 112, 114 can determine whether current is being drawn by configurable defect 110, and whether the draw on current is expected given the output from scan chain 104. In general, at least one of the vectors will be configured so that configurable defect 110 is expected to draw current, and at least another one of the vectors will be configured so that the configurable defect 110 will not draw current. If current is expected to be consumed and measured by configurable defect 110, but is not, the ATE may not be configured correctly and remedial measures can be taken to correct the configuration errors, or the DUT may be defective and can be discarded.

Note that scan output node 106 can be placed at any intermediate place along scan chain 104. Scan output node 106 is not necessarily at the end of scan chain 104.

Note that an integrated circuit device such as a microprocessor, mixed signal integrated circuit, or any other device where scan chain 104 is used can include one or more quiescent current verification systems 100. The locations of scan chains 104, logic devices 106, and configurable defects 110 can be selected to measure various supply voltages and logic blocks, as required.

Figure 2:
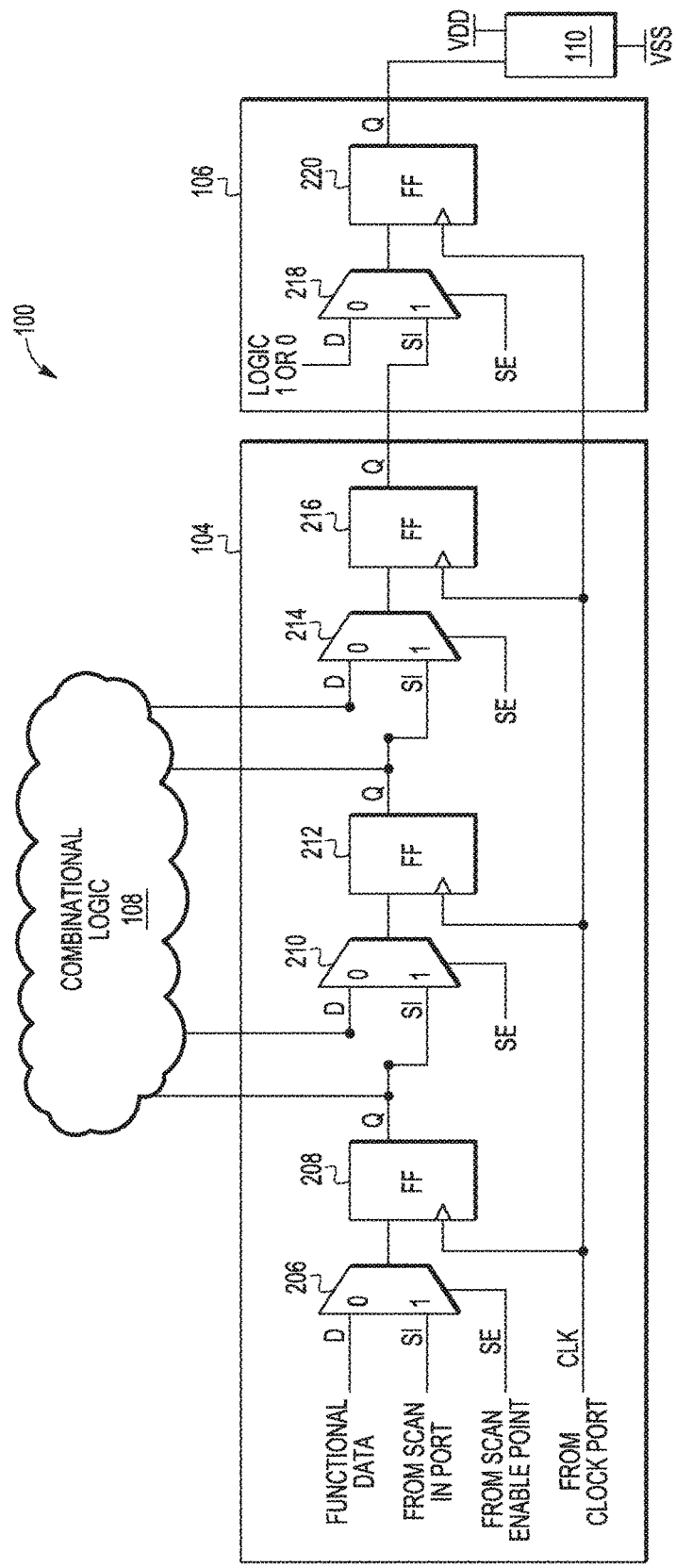
FIG. 2 is a schematic block diagram of an embodiment of a scan chain flip-flop circuitry and logic circuitry that can be used in the quiescent current verification system of FIG. 1.

FIG. 2 is a schematic block diagram of an embodiment of scan chain 104 coupled to combinational logic 108 and scan output node 106 that can be used in IDDQ verification system 100 of FIG. 1. Scan chain 104 includes a first multiplexer 206 having a functional data input D, a scan input SI, and a scan enable control signal SE that is used to select between the functional data input and the scan input. The functional data can be used during normal operation, and the scan input can be used during scan testing. The sets of values used at the scan input are referred to as test vectors, where the input values are predetermined. A set of test vectors with different sequences of values can be used to test different sections of combinational logic 108.

The output of multiplexer 206 is provided as input to a data input of flip flop circuitry 208. A clock signal is provided to a clock input of flip flop circuitry 208. An output (Q) of flip flop circuitry 208 is provided as input to combinational logic 108 and to the data input of multiplexer 210 that is part of a second stage of scan chain 104. The scan enable signal SE controls selection between data input and scan input of multiplexer 210. An output of multiplexer 210 is provided as data input to flip flop circuitry 212, which is also included in the second stage of scan chain 104. A clock signal is provided to a clock input of flip flop circuitry 212. An output (Q) of flip flop circuitry 212 is provided as input to combinational logic 108 and to the data input of multiplexer 214 that is part of a third stage of scan chain 104. The scan enable signal SE controls selection between data input and scan input of multiplexer 214. An output of multiplexer 214 is provided as data input to flip flop circuitry 216, which is also included in the third stage of scan chain 104. A clock signal is provided to a clock input of flip flop circuitry 216. An output (Q) of flip flop circuitry 216 is provided as input to multiplexer 218 that is part of scan output node 106. A second input of multiplexer 218 is coupled to a known data input, such as a logic "0" or a logic "1" as required by the configurable defect. An output of multiplexer 218 is provided as scan input to flip flop circuitry 220, which is also included in logic circuitry 106. A clock signal is provided to a clock input of flip flop circuitry 220. An output (Q) of flip flop circuitry 220 is provided as an input to configurable defect 110 and to a scan out port. Note that although only three stages are shown in scan chain 104, scan chain 104 can include any suitable number of stages.

Flip flop circuits 208, 212, 216 are connected in form of a chain, which effectively acts as a shift register. Operation of scan chain 104 involves three stages: Scan-in, Scan-capture and Scan-out. Scan-in involves shifting in and loading all the flip-flop circuits 208, 212, 216, 220 with an input vector. During scan-in, the data flows from the output of one flip flop circuitry to the scan-input of the next flip flop circuit. Once the sequence is loaded, one clock pulse (also called the capture pulse) is allowed to excite combinational logic 108 while the scan enable signal is low. The output (D) from combination logic 108 is captured at the subsequent flip flops 212, 216, 220. The data is then shifted out of flip flop 220 and the value is compared with the expected value. The captured sequence can be used as the next input vector for the next shift-in cycle. Moreover, in case of any mismatch, the captured sequence can identify nodes in combinational logic 108 where manufacturing defects may be found.

FIGS. 3-7 are schematic circuitry diagrams of examples of circuitry components that can be used as a configurable defect 110 in the quiescent current verification system 100 of FIG. 1. FIG. 3 includes a logic node in the form of inverter 302 and a conductive element in the form of resistor 304. An input of inverter 302 is coupled to the output of scan output node 106 (FIG. 2) and an output of inverter 302 is coupled to a first terminal of resistor 304. A second terminal of resistor 304 is coupled to VSS. The output of inverter 302 is high during a test mode, and current flows through resistor 304 and is measured by IDDQ current measurement circuitry 114 (FIG. 1). The output of inverter 302 is low during normal mode, and configurable defect 110 has no functional effect on quiescent current verification system 100 during the normal mode of operation.

FIG. 4 includes a logic node in the form of inverter 402 and conductive element in the form of resistor 404. An input of inverter 402 is coupled to the output of scan output node 106 (FIG. 2) and an output of inverter 402 is coupled to a first terminal of resistor 404. A second terminal of resistor 404 is coupled to supply voltage VDD. When the output of inverter 402 is low, current flows through resistor 404 and is measured by IDDQ current measurement 112 (FIG. 1), whether IDDQ current measurement circuitry 112 is coupled to the first or second terminal of resistor 404. When the output of inverter 402 is high, configurable defect 110 has no functional effect on quiescent current verification system 100 during a normal mode of operation.

Configurable defect 110 in FIG. 5 includes a logic node in the form of inverter 502 and a conductive element in the form of transistor 504. An input of inverter 502 is coupled to the output of scan output node 106 (FIG. 2) and an output of inverter 502 is coupled to a first current electrode of diode-coupled N-channel transistor 504. A second current electrode of transistor 504 is coupled to VSS. The gate electrode of transistor 504 is coupled to the output of inverter 502 and the first current electrode of transistor 504. When the output of inverter 502 is high, current flows through transistor 504 and is measured by IDDQ current measurement circuitry 114 (FIG. 1), which is coupled to the second current electrode of transistor 504. When the output of inverter 502 is low, configurable defect 110 has no functional effect on quiescent current verification system 100 during a normal mode of operation.

Configurable defect 110 in FIG. 6 includes a logic node in the form of inverter 602 and a conductive element in the form of transistor 604. An input of inverter 602 is coupled to the output of scan output node 106 (FIG. 2) and an output of inverter 602 is coupled to a gate electrode of N-channel transistor 604. A first current electrode of transistor 604 is coupled to supply voltage VDD. A second current electrode of transistor 604 is coupled to VSS. When the output of inverter 602 is high, current flows through transistor 604 and is measured by IDDQ current measurement circuitry 114 (FIG. 1), which is coupled to the second current electrode of transistor 604. When the output of inverter 602 is low, configurable defect 110 has no functional effect on quiescent current verification system 100 during a normal mode of operation.

Configurable defect 110 in FIG. 7 includes a logic node in the form of inverter 702 and a conductive element in the form of transistor 704. An input of inverter 702 is coupled to the output of scan output node 106 (FIG. 2) and an output of inverter 702 is coupled to a first current electrode of N-channel transistor 704. A second current electrode of transistor 704 is coupled to VSS. The gate electrode of transistor 704 is coupled to the supply voltage VDD. When the output of inverter 702 is high, current flows through transistor 704 and is measured by IDDQ current measurement circuitry 114 (FIG. 1), which is coupled to the second terminal of transistor 704. When the output of inverter 702 is low, configurable defect 110 has no functional effect on quiescent current verification system 100 during a normal mode of operation.

For FIGS. 3-7, in the test mode, when a quiescent current is configured and detected through resistor 304 or 404, or transistor 504, 604, or 704, an operator can determine that automated test equipment is set up correctly and the scan chain 104 and scan output node 106 (FIG. 1) are operating correctly. If no quiescent current is detected during that test mode, the integrated circuit fails quiescent current testing.

By now it should be appreciated that in some embodiments, there has been provided an integrated circuit that can include a first logic block coupled between a first power supply terminal (VDD) and a second power supply terminal (VSS). The first logic block can include a first scan chain; and a configurable defect coupled to a scan output node of the first scan chain and having a logic node and a conductive element coupled between the logic node and the first or the second power supply terminals. The configurable defect is configured to, during a quiescent current testing mode, place a predetermined logic state on the logic node such that a detectable quiescent current flows between the power supply terminals through the conductive element.

In another aspect, the first scan chain can be configured to receive a vector of bit values, wherein one bit value of the vector of bit values which corresponds to the scan output node results in the predetermined logic state on the logic node.

In another aspect, each remaining bit value of the plurality of bit values does not result in the predetermined logic state on the logic node.

In another aspect, the configurable defect is configured to have no functional effect in the first logic block during a normal mode of operation.

In another aspect, the configurable defect is configured to only be enabled during the quiescent current testing mode.

In another aspect, the configurable defect can be configured to, when the predetermined logic state is on the logic node during the quiescent current testing mode, provide a path via the conductive element between the first power supply terminal and the second power supply terminal.

In another aspect, the configurable defect can be configured to, during the quiescent current testing mode, when the predetermined logic state is not placed on the logic node, not provide a current through the conductive element.

In another aspect, the conductive element can comprise one of a resistor or a transistor.

In another aspect, the integrated circuit can further comprise a second logic block coupled between a third power supply terminal and a fourth power supply terminal, wherein the second logic block can include a second scan chain; and a second configurable defect coupled to a scan output node of the second scan chain and having a second logic node and a second conductive element coupled between the second logic node and the third and the fourth power supply terminals, wherein the second configurable defect is configured to, during the quiescent current testing mode, place a second predetermined logic state on the second logic node such that a second quiescent current flows through the second conductive element In another aspect, the first scan chain comprises a plurality of flip flops, wherein the scan output node is an output of one of the plurality of flip flops.

In another aspect, the current through the conductive element is a sufficient current to be detected.

In other selected embodiments, in an integrated circuit having a first power supply terminal and a second power supply terminal, a method can comprise in a quiescent current testing mode, providing a vector of bit values to a first input of a scan chain. A first bit value has a predetermined value and corresponds to a position of a first output of the scan chain. The first output of the scan chain is coupled to a configurable defect having a logic node and a conductive element coupled between the logic node and the first or the second power supply terminal. In the quiescent current testing mode, when the first bit value is at the position of the first output of the scan chain, a current is detected through the conductive element. If no current is detected, the integrated circuit fails quiescent current testing.

In another aspect, if the current detected through the conductive element when enabled is greater than a predetermined value, the ATE is determined to be properly configured and measuring the logic quiescent current.

In another aspect, when the first bit value has the predetermined value, a predetermined logic state is placed upon the logic node.

In another aspect, in the quiescent current testing mode, only when the predetermined logic state is placed on the logic node, the conductive element provides a current path between the first power supply terminal and the second power supply terminal.

In another aspect, each remaining bit value in the vector of bit values does not affect the predetermined logic state on the logic node.

In another aspect, the measuring of the quiescent current can be performed by automatic testing equipment (ATE).

In still other selected embodiments, an integrated circuit can comprise a first logic block coupled between a first power supply terminal and a second power supply terminal. The first logic block can include a first scan chain; and a configurable defect coupled to a scan output node of the first scan chain. The configurable defect can have a logic node and a conductive element coupled between the logic node and the first or the second power supply terminal. The configurable defect is configured to, during a quiescent current testing mode, only provide a current path between the first power supply terminal and the second power supply terminal when a predetermined logic state is placed on the logic node.

In another aspect, the first scan chain can be configured to receive a vector of bit values, wherein one bit value of the vector of bit values which corresponds to the scan output node results in the predetermined logic state on the logic node.

In another aspect, the configurable defect can be configured to have no functional effect in the first logic block during a normal mode of operation.

Because the apparatus implementing the present disclosure is, for the most part, composed of electronic components and circuits known to those skilled in the art, circuitry details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit, comprising:
    a first logic circuit coupled between a first power supply terminal and a second power supply terminal, wherein the first logic circuit includes:
        a first scan chain circuit including a scan output node;
        a configurable defect circuit connected to the scan output node of the first scan chain circuit and having a logic node and a conductive element coupled between the logic node and the first or the second power supply terminal, wherein the scan output node is configured to, during a quiescent current testing mode, place a predetermined logic state on the logic node such that a detectable current flows through the conductive element when the integrated circuit is not defective; and
        a current measurement circuit having an input coupled to an output of the configurable defect circuit and configured to detect the detectable current through the conductive element when the integrated circuit is not defective.

2. The integrated circuitry of claim 1, wherein the first scan chain circuit is configured to receive a vector of bit values, wherein one bit value of the vector of bit values which corresponds to the scan output node results in the predetermined logic state on the logic node.

3. The integrated circuitry of claim 2, wherein each remaining bit value of the plurality of bit values does not affect the predetermined logic state on the logic node.

4. The integrated circuitry of claim 1, wherein the configurable defect circuit is configured to have no functional effect in the first logic circuit during a normal mode of operation.

5. The integrated circuitry of claim 4, wherein the configurable defect circuit is configured to only be enabled during the quiescent current testing mode.

6. The integrated circuitry of claim 1, wherein the configurable defect circuit is configured to, when the predetermined logic state is on the logic node during the quiescent current testing mode, provide a path via the conductive element between the first power supply terminal and the second power supply terminal.

7. The integrated circuitry of claim 1, wherein the configurable defect circuit is configured to, during the quiescent current testing mode, when the predetermined logic state is not placed on the logic node, not provide a current through the conductive element.

8. The integrated circuitry of claim 1, wherein the conductive element comprises one of a resistor or a transistor.

9. The integrated circuitry of claim 1, further comprising a second logic circuit coupled between a third power supply terminal and a fourth power supply terminal, wherein the second logic circuit includes:
    a second scan chain circuit; and
    a second configurable defect circuit coupled to a scan output node of the second scan chain circuit and having a second logic node and a second conductive element coupled between the second logic node and the third or the fourth power supply terminal, wherein the scan output node of the second scan chain circuit is configured to, during the quiescent current testing mode, place a second predetermined logic state on the second logic node such that a second current flows through the second conductive element.

10. The integrated circuitry of claim 1, wherein the first scan chain circuit comprises a plurality of flip flops, wherein the scan output node is an output of one of the plurality of flip flops.

11. The integrated circuitry of claim 1, wherein the logic node in the configurable defect circuit comprises an inverter, the inverter including an input coupled to an output of the scan output node and an output coupled to the conductive element.

12. The integrated circuitry of claim 1, wherein the scan output node includes a multiplexer and a flip flop circuit, the multiplexer having a first input coupled to an output of a preceding scan stage circuit in the first scan chain circuit, a second input coupled to the predetermined logic state, a select enable control input, and an output coupled to a data input of a flip flop circuit.

13. The integrated circuitry of claim 12, further comprising an output of the flip flop circuit connected to an input of the current measurement circuit.

14. The integrated circuitry of claim 13, further comprising a clock signal connected to a clock input of the flip flop circuit.

15. The integrated circuitry of claim 12, further comprising:
    a combination logic circuit, wherein the preceding scan stage circuit includes a multiplexer and a flip flop circuit,
        the multiplexer of the preceding scan stage circuit having a first input coupled to an output of the combinational logic circuit,
a second input coupled to an output of a second preceding scan stage circuit in the first scan chain circuit,
a select enable control input, and
an output coupled to a data input of the flip flop circuit of the preceding scan stage circuit.

16. The integrated circuitry of claim 15, further comprising:
a first scan stage circuit in the first scan chain circuit, wherein the first scan stage circuit includes a multiplexer and a flip flop circuit,
the multiplexer of the first scan stage circuit having
a first input coupled to functional data source,
a second input coupled to receive a test vector from an output of a scan input port,
a select enable control input, and
an output coupled to a data input of the flip flop circuit of the first scan stage circuit.

17. The integrated circuitry of claim 16, further comprising an output of the flip flop circuit of the first scan stage circuit connected to an input of a multiplexer of a subsequent scan stage circuit.

18. The integrated circuitry of claim 1, wherein the current measurement circuit includes an inverter in the logic node and a resistor in the conductive element.

19. The integrated circuitry of claim 1, wherein the current measurement circuit includes an inverter in the logic node and a transistor in the conductive element.

* * * * *